United States Patent [19]
Monma et al.

[11] Patent Number: 5,928,769
[45] Date of Patent: *Jul. 27, 1999

[54] ALUMINUM NITRIDE WIRING SUBSTRATE AND METHOD FOR PRODUCTION THEREOF

[75] Inventors: Jun Monma; Hironori Asai, both of Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/821,448

[22] Filed: Mar. 21, 1997

[30] Foreign Application Priority Data

Mar. 22, 1996 [JP] Japan .................................. 8-066114

[51] Int. Cl.$^6$ ...................................................... B32B 15/04
[52] U.S. Cl. ......................... 428/210; 428/901; 174/257; 252/515; 252/518; 252/521; 103/1.13; 103/1.18
[58] Field of Search .................................... 428/210, 209, 428/910; 174/257; 252/515, 518, 521; 106/1.13, 1.18

[56] References Cited

U.S. PATENT DOCUMENTS

| | | | |
|---|---|---|---|
| 4,659,611 | 4/1987 | Iwase et al. | 428/209 |
| 4,770,953 | 9/1988 | Horiguchi et al. | 428/698 |
| 4,835,039 | 5/1989 | Barringer et al. | 428/210 |
| 4,894,273 | 1/1990 | Lieberman et al. | 428/137 |
| 5,063,121 | 11/1991 | Sato et al. | 428/698 |
| 5,167,869 | 12/1992 | Nebe et al. | 252/514 |
| 5,229,213 | 7/1993 | Horiuchi et al. | 428/457 |
| 5,641,718 | 6/1997 | Horiguchi et al. | 501/96.1 |
| 5,804,288 | 9/1998 | Monma | 428/209 |

FOREIGN PATENT DOCUMENTS 60-253294  12/1985  Japan .

*Primary Examiner*—Deborah Jones
*Assistant Examiner*—Cathy F. Lam
*Attorney, Agent, or Firm*—Finnegan, Henderson, Farabow, Garrett & Dunner, L.L.P.

[57] ABSTRACT

This invention provides an aluminum nitride wiring substrate in which a wiring metal layer for forming a signal wiring layer is densified to micropattern a signal wiring portion of an aluminum nitride package incorporating a semiconductor element therein and to increase the signal processing speed of the semiconductor element itself, the electric resistance of the wiring metal layer is reduced while keeping high thermal conductivity and insulating characteristics inherent in the aluminum nitride material to make it possible to mount a high-speed and high-output semiconductor element, and the wiring metal layer is prevented from defective wire continuity, odd appearance, or etc, and a method for the production thereof. In an aluminum nitride wiring substrate comprising an aluminum nitride substrate and a wiring metal layer provided in at least either of the surface and the interior of the aluminum nitride substrate and formed by sintering the aluminum nitride wiring substrate and the wiring metal layer, the wiring metal layer contains manganese and at least one selected from the group consisting of copper, silver, a copper alloy, and a silver alloy.

4 Claims, 1 Drawing Sheet

ALUMINUM NITRIDE WIRING SUBSTRATE AND METHOD FOR PRODUCTION THEREOF

BACKGROUND OF THE INVENTION

1. Field of the Invention

The present invention relates to an aluminum nitride wiring substrate and a method for the production thereof and, more particularly, to an aluminum nitride wiring substrate in which a wiring layer can be densified while keeping high thermal conductivity inherent in aluminum nitride, the electric resistance of the wiring layer can be reduced while keeping insulating characteristics of the substrate, and odd appearance or abnormal plating rarely occurs and a method for the production thereof.

2. Description of the Related Art

Recently, the demands for ceramic substrates have been increasing year after year in consequence of the development of such semiconductor elements as power IC's and high frequency transistors which necessitate large volumes of electric current. Particularly, aluminum nitride (AlN) substrates are characterized by high thermal conductivity, an excellent ability to radiate heat, and etc, and, owing to these features, have been attracting attention as substrates capable of efficiently serving semiconductor elements which have been tending toward increasing capacities for heat radiation.

When the aluminum nitride substrate just mentioned is used as in a semiconductor package or a circuit substrate, the practice of collectively manufacturing the aluminum nitride substrate and a wiring metal layer by simultaneous sintering is popularly followed.

The method generally adopted for the production of a simultaneously sintered aluminum nitride substrate will be described below.

First, a wiring layer-forming metallic paste containing a wiring metal is applied in a desired wiring shape to a ceramic green sheet consisting of aluminum nitride. By shaping one layer so obtained above or superposing a plurality of such layers in such a manner as to form a desired shape, an aluminum nitride compact is obtained. In this case, a wiring metal for the aluminum nitride substrate, tungsten is generally used to hold melting resistance properties (heat resistance) and to decrease the difference between the thermal expansion coefficients of the substrate and the wiring layer. Then, this aluminum nitride compact is subjected to a degreasing treatment and thereafter sintered at a prescribed temperature to sinter the aluminum nitride substrate and the wiring metal simultaneously.

In the simultaneously sintered aluminum nitride substrate under discussion, the union or bonding of the wiring metal of tungsten as with the aluminum nitride sintered body is considered to be maintained by the anchoring effect that the composite oxide of a sintering auxiliary agent and aluminum oxide enter each other's textures.

Incidentally, the process for simultaneously sintering the aluminum nitride substrate has the problem that since the sintering temperature of aluminum nitride and the densifying temperature of tungsten are different in behavior of densification, the step of simultaneous sintering tends to leave pores or voids behind in the freshly formed wiring metal layer. It further has the problem that the bonding characteristic between aluminum nitride substrate and wiring metal layer grows unstable. Thus, the practice of incorporating aluminum nitride as a component and a sintering auxiliary component therefor in a printing composition to be used for the formation of a wiring metal layer thereby equalizing the coefficient of contraction of the sintered body of aluminum nitride and that of the wiring metal and, at the same time, causing the aluminum nitride component to eliminate pores has been heretofore followed. As the result, the wiring metal is densified.

However, tungsten constituting the wiring layer disadvantageously serves as a metal having a high electric resistance, so that there is posed a problem that the resistance of the signal wiring layer of an AlN package cannot be reduced. When the aluminum nitride component having high insulating characteristics or the sintering auxiliary component is added to the printing composition of the wiring metal as cited above, if an amount thereof increases, the volume rate of metal tungsten to the wiring layer decreases. For this reason, defective wire continuity or an increase in wiring resistance easily occurs, and an high-speed and high-output element cannot be obtained. Further, when it incorporates therein the aluminum nitride component containing the sintering auxiliary component, it now contains a component destined to give rise to a liquid phase in the wiring metal layer in the process of sintering and the wiring metal layer to be obtained after the sintering tends to induce segregation of a liquid phase on or around the wiring metal layer. The produced substrate, therefore, is at a disadvantage in inducing abnormal plating or odd appearance. When the wiring metal layer has not been fully densified, the problem arises that in the heating test subsequent to the formation of a plating layer or a thin-film wiring layer, etc thereon, the plating liquid filled in voids expands or is gasified, and defective expansion tends to occur in the plating layer or in the thin-film wiring layer, and etc.

On the other hand, with the increase in integration density of a recent semiconductor element, high-density packaging, or miniaturizing of parts, micropatterning of a signal wiring mounted on a semiconductor element proceeds, and the section of the wiring tends to decrease. In order to increase a signal transmission rate to realize high-speed processing, it is proposed as a practical problem that the electric resistance of the wiring layer such as a signal wiring is further reduced.

When a signal response speed increases, and an increase in arithmetic processing amount of the semiconductor element and an increase in scale of the element following it, heat generated by the element increases. A countermeasure for effectively radiating the heat is necessary, but a sufficient means for solving the problem has not been obtained.

Further, the following knowledge has been obtained by the present inventors. Namely, when copper, silver, a copper compound, or a silver compound is added to an AlN green sheet serving as a substrate, and the AlN green sheet and a wiring layer-forming paste applied thereon are simultaneously sintered, a copper alloy or a silver alloy are precipitated in the wiring metal layer. The knowledge that the above is effective to decrease the electric resistance of the wiring metal layer.

However, a copper or silver component is liable to be precipitated in the wring metal layer, and, at the same time, is easily left in an aluminum nitride sintered body. For this reason, the copper or silver compound advantageously decrease the insulating resistance of the entire wiring substrate. On the other hand, when the copper or silver compound is added to a wiring layer-forming paste, densification of the wiring metal layer consisting of tungsten is easily obstructed, and only a wiring substrate having a wiring metal layer having a large number of voids can be obtained.

On the other hand, when manganese or a manganese compound is added to the wiring metal layer, densification of the wiring metal layer is enhanced, but the electric resistance of the wiring metal layer disadvantageously increases. In any cases, there can hardly be obtained a wiring substrate which can completely satisfy the densification and low resistance of the wiring metal layer and the high thermal conductivity and insulating characteristics of the substrate.

SUMMARY OF THE INVENTION

The present invention has been made to solve the above problems, and has an object to provide an aluminum nitride wiring substrate in which a wiring metal layer for forming a signal wiring layer is densified to cope with micropattern of a signal wiring portion of an aluminum nitride package incorporating a semiconductor element therein and to increase the signal processing speed of the semiconductor element itself, the electric resistance of the wiring metal layer is reduced while keeping high thermal conductivity and insulating characteristics inherent in the aluminum nitride material to make it possible to mount a high-speed and high-output semiconductor element, and the wiring metal layer is prevented from defective wire continuity, odd appearance, or etc.

In order to achieve the above object, the present inventors had researched various materials enabling to densify the wiring metal layer and to reduce the resistance of the wiring metal layer. Then, the inventors added these materials to a wiring layer-forming paste or an aluminum nitride (AlN) green sheet to manufacture an aluminum nitride simultaneously sintered wiring substrate, and compared and discussed the influences of conditions such as the type of the above additive, an amount of additive, or an adding method with respect to the density and electric resistance of the resulting wiring metal layer, the appearance of the substrate, or etc.

As a result, the following is clearly confirmed and understood. That is, when a predetermined amount of at least one selected from copper, silver, a copper compound, and a silver compound and a predetermined amount of at least either of manganese and a manganese compound are added to at least either of an AlN green sheet serving as a substrate and a wiring layer-forming paste serving as a wiring metal layer, and the wiring layer-forming paste and the green sheet are simultaneously sintered in a non-oxidizing atmosphere, a dense wiring metal layer can be obtained, and copper, silver, a copper alloy, or a silver alloy is precipitated in the wiring metal layer. For this reason, the electric resistance of the wiring metal layer can be effectively reduced. The present invention is completed on the basis of the above knowledge or findings.

More specifically, according to the present invention, an aluminum nitride wiring substrate comprises an aluminum nitride substrate and a wiring metal layer provided in at least either of the surface and the interior of the aluminum nitride substrate, is formed by sintering the aluminum nitride wiring substrate and the wiring metal layer, is characterized in that the wiring metal layer contains at least one selected from the group consisting of copper, silver, a copper alloy, and a silver alloy and manganese.

The wiring metal layer preferably consists of a metal material containing tungsten as a main component. The wiring metal layer contains at least one selected from copper and silver in an amount in the range of 0.0001 to 2% by weight. The wiring metal layer further contains manganese in an amount in the range of from 0.001 to 2 by weight.

According to the present invention, a method for the production of an aluminum nitride wiring substrate comprises a step of applying a wiring layer-forming paste containing a wiring metal in a desired shape to an aluminum nitride green sheet and superposing one aluminum nitride green sheet or a plurality of aluminum nitride green sheets to fabricate an aluminum nitride compact, and a step of sintering the aluminum nitride compact to simultaneously sinter the aluminum nitride wiring substrate and the wiring metal, and is characterized in that at least one selected from the group consisting of copper, silver, a copper compound, and a silver compound and at least one selected from metal manganese and a manganese compound are added to at least either of the aluminum nitride green sheet and the wiring layer-forming paste.

A copper oxide is preferably used as the copper compound. Silver oxide or silver tungstic is preferably used as the silver compound. Manganese oxide is preferably used as the manganese compound.

In the method for the production of the AlN wiring substrate, an amount of at least one selected from copper and silver added to the aluminum nitride green sheet is in the range of from 0.02 to 2 mol % with respect to the amount of aluminum nitride. An amount of manganese added to the aluminum nitride green sheet is in the range of from 0.02 to 2 mol % with respect to the amount of aluminum nitride. An amount of at least one selected from copper and silver added to the wiring layer-forming paste is in the range of from 0.01 to 3% by weight with respect to the amount of wiring metal. An amount of manganese added to the wiring layer-forming paste is in the range of from 0.01 to 5% by weight with respect to the amount of wiring metal.

Although either of cuprous oxide ($Cu_2O$) and cupric oxide (CuO) can be used as the copper oxide, cuprous oxide ($Cu_2O$) having a smaller oxygen content is more preferably used. As the silver compound, silver oxide ($Ag_2O$) or silver tungstic ($Ag_2WO_3$) is more preferably used as the silver compound.

The copper oxide and the silver oxide are reduced in an atmosphere where the aluminum nitride green sheet and the wiring layer-forming paste are sintered to be melted as metal copper and a copper alloy or metal silver and a silver alloy. Since the metal copper or silver has poor wettability with respect to the aluminum nitride, the metal copper or silver is concentrated in the metal conductive layer and precipitated as copper, a copper alloy, a silver or silver alloy in the process of cooling the entire substrate. For this reason, finally, there can be obtained a signal wiring layer in which copper, a copper alloy, silver, or a silver alloy having a low electric resistance is precipitated in the wiring metal layer consisting of tungsten or etc.

When copper oxide is added to at least either of the aluminum nitride green sheet and the wiring layer-forming paste to precipitate copper or copper alloy in the wiring metal, or a silver compound is added to at least either of the aluminum nitride green sheet and the wiring layer-forming paste to precipitate silver or silver alloy, the sintering rate of the wiring metal may increased to enhance growth of wiring metal particles themselves. It is understood that a decrease in wiring resistance is enhanced by the particle growth and the precipitation of copper, copper alloy, silver, or silver alloy. In this manner, by enhancing the growth of the wiring metal particles themselves, the decrease in resistance of the wiring layer can be enhanced in the simultaneous sintering process of the wiring metal and the aluminum nitride compact.

More specifically, when copper oxide or a silver compound is added to at least either of the aluminum nitride green sheet and the wiring layer-forming paste, copper or silver can be precipitated in the wiring metal such as tungsten in simultaneous sintering without impairing the sintering of aluminum nitride, and the melting point of the wiring metal can be substantially decreased. As a result, since the sintering rapidly progresses, a dense wiring metal layer having a resistance lower than that of pure tungsten can be formed.

However, the copper or silver component is easily left or remained in the AlN substrate so as to cause the insulating resistance of the AlN substrate to tend to decrease. Further, when the copper or silver component enters the wring metal layer, the densification of the wiring metal layer tends to be obstructed.

Therefore, according to the present invention, in addition to the copper or silver component cited above, a predetermined amount of a manganese (Mn) component is added to the AlN substrate. Owing to the addition of the manganese component, concentrical precipitation of the copper or silver component in the wiring metal layer is enhanced. For this reason, the electric resistance of the wiring metal layer is further reduced, and, at the same time, densification of the wiring metal layer is especially enhanced, so that the rate of occurrence of defects such as plating expansion can be considerably reduced.

That is, a predetermined amount of manganese component and a predetermined amount of at least one selected from the copper component and the silver component are added in combination, so that there can be obtained a simultaneously sintered aluminum nitride wiring substrate constituted by the densified wiring metal layer having a lower electric resistance and the aluminum nitride substrate having a high insulating resistance.

When an impurity is mixed in an aluminum nitride sintered body, the high thermal conductivity inherent in the aluminum nitride sintered body may be degraded. In particular, when an impurity element such as oxygen which is solid-solved in the crystal lattice of the aluminum nitride sintered body is prevented from being mixed in the aluminum nitride sintered body, the thermal conductivity of the sintered body can be prevented from decreasing. Therefore, when the high thermal conductivity of the wiring substrate is required as main characteristics, high-purity copper oxide powder, silver compound powder, or manganese powder is preferably added. In particular, as the copper oxide powder, fine copper oxide powder which has a purity of 99% or more and is easily available is preferably applied.

As the wiring layer-forming metal used in the present invention, a metal material containing, as a main component, refractory tungsten which can be simultaneously sintered with aluminum nitride is preferably used. As tungsten powder used in formation of a wiring layer-forming paste, relatively coarsen powder having an average grain size of 2 to 20 $\mu$m is preferably used, so that the contraction coefficient of the wiring metal can be approximated to the contraction coefficient of the aluminum nitride green sheet.

As a method of adding the copper oxide powder, the silver compound powder, or the manganese component, a method of adding the powder or the component to at least either of the aluminum nitride green sheet and the wiring layer-forming paste in advance is preferably used. As the contents of the additives to be added to the green sheet, the contents of at least one selected from copper oxide and a silver compound and a manganese-containing compound are preferably set in the range of from about 0.02 to 2.0 mol % based on the amount of aluminum nitride in metal units.

When the content of at least one selected from copper oxide and the silver compound and the content of the manganese-containing compound are excessively small, i.e., smaller than 0.02 mol %, densification of the wiring metal such as tungsten cannot be sufficiently performed. On the other hand, when the contents of additives are excessively large, i.e., exceeds 2.0 mol %, owing to the short circuit of the wiring, extension of migration of the wiring layer, and etc, odd appearance or an operational defect occurs. At the same time, characteristic deterioration that the thermal conductivity or insulating resistance of the aluminum nitride substrate decrease or that a variation in electric resistance of the wiring layer increases may be caused.

Therefore, in order to satisfy both the characteristics, i.e., the thermal conductivity and the wiring resistance of the AlN substrate, the content of at least one selected from the copper oxide and the silver compound and the content of the manganese-contained compound are more preferably set in the range of from 0.10 to 1.00 mol %.

The addition rates of the components when the copper component powder or silver compound powder and manganese component powder are added to the wiring layer-forming paste in advance are set in the following ranges for the reason cited above. More specifically, at least one selected from the copper component powder and the silver component powder is preferably added to the wiring metal in the range of from 0.01 to 3% by weight in a metal unit. On the other hand, the manganese component powder is preferably added in the range of 0.01 to 5% by weight in a metal unit.

The content of at least one selected from copper and silver in the wiring metal layer formed by simultaneously sintering the aluminum nitride green sheet and the wiring layer-forming paste to which at least one selected from the copper component and the silver component and the manganese component at the additive rates cited above is 0.0001 to 2% by weight, and the content of manganese is set in the range from of 0.001 to 2% by weight. However, for the same reason as cited above, the content of each component is more preferably set in the range from of 0.01 to 1% by weight. The porosity of the wiring metal layer obtained by sintering is set to 2% or less, preferably 1% or less, and more preferably 0.5% or less.

In the production method of an aluminum nitride wiring substrate according to the present invention, for example, at least one selected from copper oxide and a silver compound and a manganese-contained compound are added to at least either of the aluminum nitride green sheet and the wiring layer-forming paste, a wiring layer-forming metal paste is applied to each sheet surface in a desired wiring shape as needed, and one sheet or a plurality of sheets are superposed to fabricate an aluminum nitride compact. The aluminum nitride compact is degreased and then sintered in a non-oxidizing atmosphere such as a nitrogen atmosphere or etc to simultaneously sinter the aluminum nitride substrate and the wiring metal. As a result, there can be obtained a simultaneously sintered aluminum nitride wiring substrate having the wiring layer on the surface thereof or in the interior thereof.

According to the aluminum nitride wiring substrate with the above arrangement and the method for the production thereof, since at least one selected from copper oxide and a silver compound and a manganese-containing compound are contained in at least either of the aluminum nitride green sheet and the wiring layer-forming paste, the copper component of oxide copper or the silver component of the silver compound is precipitated or dissolved in the wiring metal layer consisting of tungsten or the like during the simultaneous sintering to form a signal wiring layer having a low resistance.

Further, since manganese enhances concentrical precipitation of copper and silver in the wiring metal layer, a dense wiring metal layer having a low resistance can be formed. Therefore, there can be obtained an aluminum nitride wiring substrate which can cope with micropatterning and high-speed processing of the wiring metal layer.

The melting point of the wiring metal is substantially lowered, and an effect that densification is enhanced is obtained. For this reason, an aluminum nitride wiring substrate can also be manufactured at a low temperature range of about 1,600° C.

In addition, since the wiring metal layer is densified, when a plating layer or a thin film consisting of an organic material, an inorganic material, and a metal is formed on the wiring metal layer after the simultaneous sintering, a liquid component or an organic impurity does not enter the wiring layer, and a defective factor such as generation of a decomposition gas component or abnormal expansion caused by heat treatment following production inspection can be avoided. As a result, a wiring substrate having excellent reliability and a thin-film multilayered substrate can be provided. Further, since the wiring metal layer rarely contains a substance which causes defective wire continuity or odd appearance, the wiring metal layer has a low resistance and an excellent appearance.

DESCRIPTION OF THE PREFERRED EMBODIMENT

An embodiment of the present invention will be described below with reference to the following examples.

EXAMPLE 1

Copper (Cu) powder with a purity of 99% and manganese (Mn) powder with a purity of 99% were prepared. The copper powder was added to aluminum nitride at a rate of 1 mol %, the manganese powder was added to the aluminum nitride material powder at a rate of 0.3 mol %, and yttrium oxide powder serving a sintering auxiliary agent was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Figure 1:
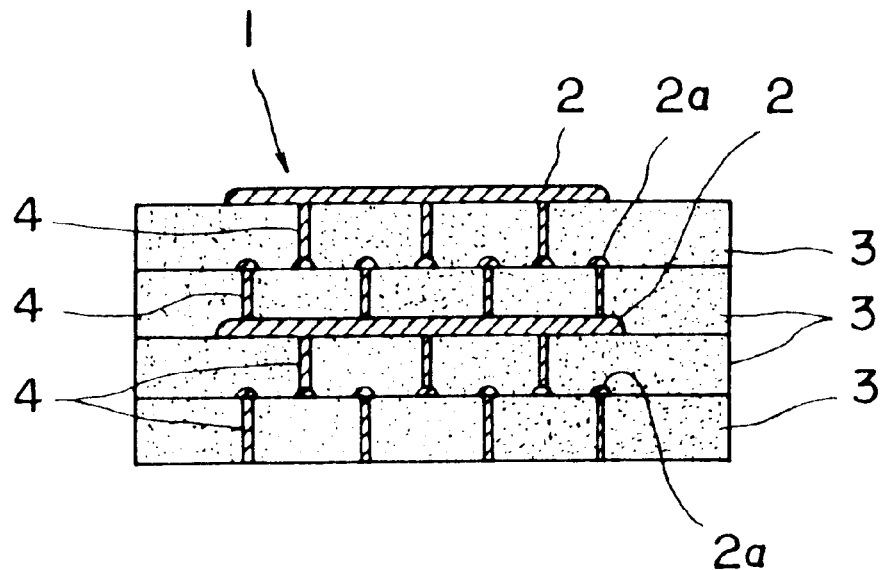
FIG. 1 is a cross sectional view illustrating the structure of an AlN multi-layered wiring substrate according to an embodiment of the present invention.

Then, through holes were formed in each aluminum nitride green sheet and filled with a tungsten paste. Thereafter, a fine signal wiring pattern having a width of 80 μm was printed on the sheet surface. Four aluminum nitride green sheets containing the copper powder and manganese powder were sequentially superposed to form a compact. The obtained compact was degreased and sintered in a nitrogen atmosphere at 1,800° C. to fabricate an AlN multilayered wiring substrate 1 according to Example 1 as shown in FIG. 1.

The AlN multilayered wiring substrate 1 according to Example 1 is formed such that four aluminum nitride substrates 3 on which wiring metal layers 2 and 2a such as signal wiring layers are formed are integrally joined to each other. The wiring metal layers 2 and 2a formed on the surface of each of the aluminum nitride substrates 3 containing copper and manganese are electrically connected to each other via through holes 4 formed in the direction of the thickness of AlN substrate.

EXAMPLE 2

Cupric oxide (CuO) powder, serving as a copper compound, with a purity of 99% is prepared, and the cupric oxide powder was added to an aluminum nitride material powder at a rate of 1 mol % in a metal copper unit. In addition, manganese (Mn) powder with a purity of 99% was added to the above powder at a rate of 0.3 mol % in the same manner as described above, and yttrium oxide powder serving as an auxiliary agent was added to the powder at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Then, through holes were formed in each aluminum nitride green sheet and filled with a tungsten paste. Thereafter, a fine signal wiring pattern having a width of 80 μm was printed on the sheet surface. Four printed aluminum nitride green sheets were sequentially superposed to form a compact. The obtained compact was degreased and sintered in a nitrogen atmosphere at 1,800° C. to fabricate an AlN multilayered wiring substrate 1 according to Example 2 as shown in FIG. 1.

EXAMPLE 3

Silver (Ag) powder with a purity of 99% and manganese (Mn) powder with a purity of 99% were prepared. The silver powder was added to aluminum nitride at a rate of 1 mol %, the manganese powder was added to the aluminum nitride material powder at a rate of 0.3 mol %, and yttrium oxide powder serving a sintering auxiliary agent was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Through holes were formed in each aluminum nitride green sheet and filled with a tungsten paste. Thereafter, a fine signal wiring pattern having a width of 80 μm was printed on the sheet surface. Four aluminum nitride green sheets containing the silver powder and manganese powder were sequentially superposed. The obtained multilayered structure was degreased and then sintered in a nitrogen atmosphere at 1,800° C. to fabricate an AlN multilayered wiring substrate 1 according to Example 3 as shown in FIG. 1.

EXAMPLE 4

Silver oxide ($Ag_2O$) powder, serving as a silver compound, with a purity of 99% and manganese (Mn) powder with a purity of 99% were prepared. The silver oxide powder was added to aluminum nitride at a rate of 1 mol % in a metal copper unit, the Mn powder was added to aluminum nitride material powder at a rate of 0.3 mol %, yttrium oxide powder serving a sintering auxiliary was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Through holes were formed in each aluminum nitride green sheet and filled with a tungsten paste. Thereafter, a fine signal wiring pattern having a width of 80 μm was printed on the sheet surface. Four aluminum nitride green sheets containing the silver oxide powder and manganese powder were sequentially superposed. The obtained compact was degreased and then sintered in a nitrogen atmosphere at 1,800° C. to fabricate an AlN multilayered wiring substrate according to Example 4 as shown in FIG. 1.

EXAMPLE 5

Yttrium oxide powder serving as a sintering auxiliary agent was added to aluminum nitride material powder at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor brade method.

Copper (Cu) powder with a purity of 99% and manganese (Mn) powder with a purity of 99% were prepared. The Cu powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed. The obtained compact was degreased and then sintered in a nitrogen atmosphere at 1,800° C. to fabricate an AlN multilayered wiring substrate 1 according to Example 5 as shown in FIG. 1.

EXAMPLE 6

Yttrium oxide powder serving as a sintering auxiliary was added to aluminum nitride material powder at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Silver (Ag) powder with a purity of 99% and manganese (Mn) powder with a purity of 99% were prepared. The Ag powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed to form a compact. The obtained compact was degreased and then sintered in a nitrogen atmosphere at 1,800° C. to fabricate an AlN multilayered wiring substrate 1 according to Example 6 as shown in FIG. 1.

EXAMPLE 7

Yttrium oxide powder serving as a sintering auxiliary agent was added to aluminum nitride material powder at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Cupric oxide (CuO) powder with a purity of 99% and manganese (Mn) powder with a purity of 99% were prepared. The CuO powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80μm was printed on the sheet surface. Four aluminum nitride green sheets on which the wiring patterns were printed were sequentially superposed to form a compact. The obtained compact was degreased and then sintered in a nitrogen atmosphere at 1,800° C. to fabricate an AlN multilayered wiring substrate 1 according to Example 7 as shown in FIG. 1.

EXAMPLE 8

Yttrium oxide powder serving as a sintering auxiliary was added to aluminum nitride material powder at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Silver oxide ($Ag_2O$) powder with a purity of 99% and manganese (Mn) powder with a purity of 99% were prepared. The $Ag_2O$ powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed to form a compact. The obtained compact was degreased and then sintered in a nitrogen atmosphere at 1,800° C. to fabricate an AlN multilayered wiring substrate 1 according to Example 8 as shown in FIG. 1.

EXAMPLE 9

Copper (Cu) powder with a purity of 99% and manganese (Mn) powder with a purity of 99% were prepared. The Cu powder and the manganese powder were added to aluminum nitride material powder at a rate of 1 mol % and a rate of 0.3 mol %, respectively, and yttrium oxide powder serving a sintering auxiliary agent was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Copper (Cu) powder with a purity of 99% and manganese (Mn) powder with a purity of 99% were prepared. The Cu powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed to form a compact. The obtained compact was degreased and then sintered in a nitrogen atmosphere at 1,800° C. to fabricate an AlN multilayered wiring substrate 1 according to Example 9 as shown in FIG. 1.

EXAMPLE 10

Copper oxide (CuO) powder with a purity of 99% and manganese (Mn) powder with a purity of 99% were prepared. The CuO powder and the manganese powder were added to aluminum nitride material powder at a rate of 1 mol % and a rate of 0.3 mol %, respectively, and yttrium oxide powder serving a sintering auxiliary was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Copper oxide (CuO) powder with a purity of 99% and manganese (Mn) powder with a purity of 99% were prepared. The CuO powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed to form a compact. The obtained compact was degreased and then sintered in a nitrogen atmosphere at 1,800° C. to fabricate an AlN multilayered wiring substrate 1 according to Example 10 as shown in FIG. 1.

EXAMPLE 11

Silver (Ag) powder with a purity of 99% and manganese (Mn) powder with a purity of 99% were prepared. The Ag powder and the manganese powder were added to aluminum nitride material powder at a rate of 1 mol % and a rate of 0.3 mol %, respectively, and yttrium oxide powder serving a sintering auxiliary agent was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed from the mixture by using a doctor blade method.

Silver (Ag) powder with a purity of 99% and manganese (Mn) powder with a purity of 99% were prepared. The Ag powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed to form a compact. The obtained compact was degreased and then sintered in a nitrogen atmosphere at 1,800° C. to fabricate an AlN multilayered wiring substrate 1 according to Example 11 as shown in FIG. 1.

EXAMPLE 12

Silver oxide ($Ag_2O$) powder with a purity of 99% and manganese (Mn) powder with a purity of 99% were prepared. The $Ag_2O$ powder and the manganese powder were added to aluminum nitride material powder at a rate of 1 mol % and a rate of 0.3 mol %, respectively, and yttrium oxide powder serving a sintering auxiliary was added to the resultant material at a rate of 5% by weight to prepare a powdery mixture. An interfacial active agent and an acrylic resin serving as a binder were added to the prepared powdery mixture at 0.5% by weight and 15% by weight, respectively. The resultant powdery mixture was mixed by means of a ball mill and adjusted in viscosity, and an aluminum nitride green sheet was formed by using a doctor blade method.

Silver oxide ($Ag_2O$) powder with a purity of 99% and manganese (Mn) powder with a purity of 99% were prepared. The $Ag_2O$ powder and Mn powder were added to tungsten serving as a wiring metal at rates of 5% by weight and 1% by weight, respectively. An organic binder and an organic solvent were mixed into the obtained mixture to prepare a wiring layer-forming paste.

Through holes were formed in each aluminum nitride green sheet and filled with the wiring layer-forming tungsten paste. Thereafter, a fine signal wiring pattern having a width of 80 μm was printed on the sheet surface. Four aluminum nitride green sheets on which the wiring patterns were printed were sequentially superposed. The obtained compact was degreased and then sintered in a nitrogen atmosphere at 1,800° C. to fabricate an AlN multilayered wiring substrate 1 according to Example 12 as shown in FIG. 1.

COMPARATIVE EXAMPLE

A substrate was fabricated by simultaneously sintering aluminum nitride and tungsten under the same conditions as in Example 1 except that any Cu component, Ag component, and Mn component were not added to all the aluminum nitride green sheets and the wiring layer-forming paste which constitute the compact. The simultaneously sintered substrate according to Comparative Example was sintered together with the substrate of Example 1 in the same furnace.

Figure 2:
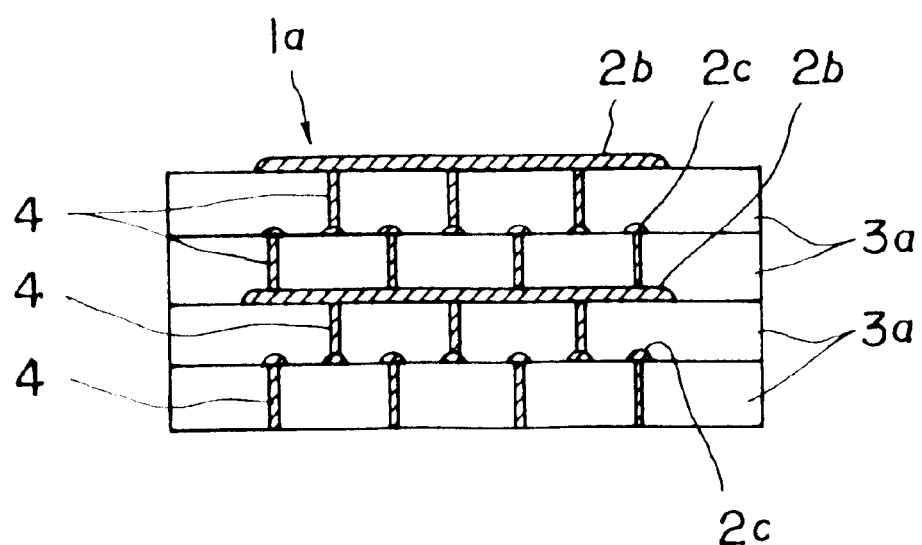
FIG. 2 is a cross sectional view illustrating the structure of an AlN multi-layered wiring substrate according to a comparative example.

As shown in FIG. 2, the AlN multilayered wiring substrate 1a according to Comparative Example is formed such that four aluminum nitride substrates 3a on which wiring metal layers 2b and 2c such as signal wiring layers are formed are integrally joined to each other. The wiring metal layers 2b and 2c formed on the surface of each of the aluminum nitride substrates 3a which do not contain Cu, Ag, and Mn components are electrically connected to each other via through holes 4 formed in the direction of the thickness of the respective AlN substrate 3a.

The average values of the wiring resistances of the aluminum nitride wiring substrates, prepared as cited above, according to Examples and Comparative Example and the degrees of densification of the wiring metal layers of the aluminum nitride wiring substrates were measured to obtain results shown in Table 1 described below. The degree of densification of the wiring metal layer is shown as a value obtained by counting the number of pores or voids each having a diameter of 5 μm or more and existing per 1 mm$^2$ sectional texture of the wiring metal layer with texture observation using a scanning electron microscope (SEM).

After a plating layer and a thin film wiring were formed on a wiring metal layer surface, the rates of occurrence of defective expansion, abnormal plating, and odd appearance caused by expansion or gasification of plating liquid and etc filled in the pores were examined to obtain results shown in Table 1 described below.

TABLE 1

| Sample No. | Wiring Resistance (m Ω) | Number of Pores Existing per 1-mm$^2$ Wiring Metal Layer Section | Rate of Occurrence of Defective Expansion of Plating Layer and Thin Film Wiring (%) |
| --- | --- | --- | --- |
| Example 1 | 274 | 0 | 0 |
| Example 2 | 238 | 0 | 0 |
| Example 3 | 278 | 0 | 0 |
| Example 4 | 248 | 0 | 0 |
| Example 5 | 289 | 0 | 0 |
| Example 6 | 259 | 0 | 0 |
| Example 7 | 294 | 0 | 0 |
| Example 8 | 266 | 0 | 0 |
| Example 9 | 267 | 0 | 0 |
| Example 10 | 233 | 0 | 0 |
| Example 11 | 270 | 0 | 0 |
| Example 12 | 234 | 0 | 0 |
| Comparative Example | 415 | 50 | 18 |

As is apparent from the result shown in Table 1, a Cu component, Ag component, and Mn component are added to at least either of an aluminum nitride green sheet and a wiring layer-forming paste, and the green sheet and the wiring pattern are simultaneously sintered to prepare aluminum nitride multilayered wiring substrates according to Examples. The wiring resistances of the aluminum nitride multilayered wiring substrates of Examples are reduced to about 30 to 40% of the wiring resistance of the multilayered wiring substrate of Comparative Example. Therefore, it was confirmed that the present invention can sufficiently cope with the high-speed processing of an electronic equipment using the multilayered wiring substrate.

In particular, since copper or silver serving as a high-conductivity component was precipitated in the wiring metal layer, the electric resistance of the wiring metal layer considerably decreased. In addition, owing to the function of the manganese component, densification of the wiring metal layer sufficiently proceeded. Since defective expansion, defective plating, odd appearance caused by the pores or voids could be effectively suppressed from occurring, the production yield of wiring substrates could be considerably increased. Each wiring metal layer had a porosity of 0.1 to 1.2%, and was formed to have a high density.

As has been described above, according to an aluminum nitride wiring substrate of the present invention and a method for the production thereof, at least either of copper oxide and a silver compound is contained in at least either of an aluminum nitride green sheet and a wiring layer-forming paste. For this reason, the copper component of copper oxide or the silver component of the silver compound is precipitated or dissolved in the wiring metal layer consisting of tungsten or the like during the simultaneous sintering to form a signal wiring layer having a low resistance. Since manganese enhances concentrical precipitation of copper and silver in the wiring metal layer, a dense wiring metal layer having a low resistance can be formed. Therefore, there can be obtained an aluminum nitride wiring substrate which can cope with micropatterning and high-speed processing of the wiring metal layer.

The melting point of the wiring metal can be substantially lowered, and an effect that densification is enhanced is obtained. For this reason, an aluminum nitride wiring substrate can also be manufactured at a low temperature range of about 1,600° C.

In addition, since the wiring metal layer is densified, when a plating layer or a thin film consisting of an organic material, an inorganic material, and a metal is formed on the wiring metal layer after the simultaneous sintering, a liquid component or an organic impurity does not enter the wiring layer, and a defective factor such as generation of a decomposition gas component or abnormal expansion caused by heat treatment following production inspection can be avoided. As a result, a wiring substrate having excellent reliability and a thin-film multilayered substrate can be provided. Further, since the wiring metal layer rarely contains a substance which causes defective wire continuity or odd appearance, the wiring metal layer has a low resistance and an excellent appearance.

What is claimed is:

1. An aluminum nitride wiring substrate comprising an aluminum nitride substrate and a wiring metal layer, wherein said wiring metal layer is provided at least on the surface of said aluminum nitride substrate or in the interior of said aluminum nitride substrate and the aluminum nitride wiring substrate is formed by simultaneously sintering said aluminum nitride substrate and said wiring metal layer, and wherein said wiring metal layer consists essentially of a metal material consisting essentially of tungsten as a main component, manganese from 0.001 to 2% by weight, and at least one material selected from the group consisting of copper, silver, a copper alloy, and a silver alloy, with the total copper and silver from 0.0001 to 2% by weight.

2. An aluminum nitride wiring substrate comprising:

an aluminum nitride substrate;

a tungsten wiring metal layer consisting essentially of tungsten, manganese from 0.001 to 2% by weight, and at least one material selected from the group consisting of copper, silver, a copper alloy, and a silver alloy, with total copper and silver from 0.001 to 2% by weight;

wherein the aluminum nitride substrate is simultaneously sintered with the tungsten wiring metal layer thereby forming a diffusion bonded wiring substrate wherein the copper or silver material is precipitated in the wiring metal layer.

3. An aluminum nitride wiring substrate according to claim 2 wherein said wiring layer consists of a metal material consisting of tungsten as a main component.

4. An aluminum nitride wiring substrate according to claim 1 or 2, wherein said wiring metal layer has a porosity of not more than 2%.

* * * * *